United States Patent [19]
Krivokapic

[11] Patent Number: 6,025,235
[45] Date of Patent: Feb. 15, 2000

[54] SHORT CHANNEL TRANSISTOR HAVING RESISTIVE GATE EXTENSIONS

[75] Inventor: Zoran Krivokapic, Santa Clara, Calif.

[73] Assignee: Advanced Micro Devices, Inc., Sunnyvale, Calif.

[21] Appl. No.: 09/037,488

[22] Filed: Mar. 10, 1998

Related U.S. Application Data

[62] Division of application No. 08/890,104, Jul. 9, 1997.

[51] Int. Cl.[7] ....................... H01L 21/334; H01L 21/335; H01L 21/336; H01L 21/38
[52] U.S. Cl. ......................... 438/289; 438/299; 438/301; 438/303; 438/305; 438/542; 438/545; 438/546; 257/344; 257/346; 257/335; 257/336
[58] Field of Search .................................... 438/300, 289; 257/335, 336, 344, 346

*Primary Examiner*—Tom Thomas
*Assistant Examiner*—Bernard E. Souw
*Attorney, Agent, or Firm*—Fliesler Dubb Meyer & Lovejoy LLP

[57] ABSTRACT

A semiconductor apparatus formed on a semiconductor substrate includes a first active region in the substrate, and a second active region adjacent to the surface of the substrate separated from the first active region by a channel region. A gate oxide region may overlie at least a portion of the first and second active regions. The apparatus further includes a gate positioned over the channel region and having a first end and a second end respectively associated with the first and second active regions. The gate includes a first low conductive region and a second low conduction region at said first and second ends, respectively.

A method for making the transistor structure of the present invention is also provided. In one aspect, the invention comprises: forming a transistor region on a silicon substrate, the region including a first and second spacers on a first side and a second side of the region, respectively, the spacers overlying a first oxide layer on the surface of the substrate; etching the first oxide layer leaving a first and second gaps between the first and second spacers, respectively, and the silicon substrate; forming a gate oxide layer overlying the surface of the substrate in the transistor region, the gate oxide having a thickness; and filling the transistor region with polysilicon to cover the gate oxide region.

7 Claims, 6 Drawing Sheets

SHORT CHANNEL TRANSISTOR HAVING RESISTIVE GATE EXTENSIONS

"This application is a divisional of Ser. No. 08/890,104, filed Jul. 9, 1997."

CROSS-REFERENCE TO RELATED APPLICATIONS

ADAPTIVELY CONTROLLED, SELF-ALIGNED, SHORT CHANNEL DEVICE AND METHOD FOR MANUFACTURING SAME, U.S. patent application Ser. No. 08/890,104, filed Jul. 9, 1997, inventor Zoran Krivokapic, owned by the assignee of the present application.

METHOD AND APPARATUS FOR A SEMICONDUCTOR DEVICE WITH ADJUSTABLE THRESHOLD VOLTAGE, U.S. patent application Ser. No. 08/891,422, filed Jul. 9, 1997, inventor Zoran Krivokapic, owned by the assignee of the present application.

These applications are specifically incorporated herein by reference.

BACKGROUND OF THE INVENTION

1. Field of the Invention

The present invention generally relates to the field of semiconductor devices and more particularly to an adaptively controlled, self-aligned, short channel semiconductor device and method for manufacturing the same.

2. Description of the Related Art

The trend in the semiconductor industry is to reduce the geometry of semiconductor devices to thereby increase the number of such devices available in a given area (increased density) of an integrated circuit (IC) chip. As the integration degree of semiconductor devices becomes higher, the device size must be reduced. The increased density of semiconductor devices in a given area of an IC chip results in an increased performance by the IC chip including faster operating speeds and lower power consumption necessary to supply the IC chip.

The size of a semiconductor device such as a transistor is in large part dependent on the length of the "channel" of the transistor, that is, a thin region of the device that supports conduction. A conventional semiconductor device known as a silicon gate metal oxide ("MOS") field effect transistor 5 (MOS transistor) depicting a channel region is shown in prior art FIG. 1. (In the attached figures, it should be understood that the thicknesses are not represented to scale and the cross-sections are exaggerated for clarity in the explanation of the invention). The MOS transistor is formed on a silicon wafer 10, typically a P-type wafer. The silicon wafer 10 is doped with an N-type impurity to form a source region 15 and drain region 20, with the distance between the source and drain regions defining the channel length 25 of the MOS transistor 5. Isolation oxide regions 30 isolate the MOS transistor 5 from other devices on the wafer. The gate structure 35 is composed of a polysilicon region 40 and a gate oxide 45. A deposited oxide layer 46 surrounds the gate structure 35, while conductive metal layers 50 are coupled to the source, drain and gate to couple the device to other devices on the IC.

Channel lengths, such as the channel length 25 of FIG. 1, are currently defined in the submicron region. State of the art devices currently have channel lengths ranging from approximately 0.18 $\mu$m to 0.25 $\mu$m. The trend discussed above to reduce the geometry of semiconductor devices has resulted in attempts to reduce the channel length of a semiconductor device to dimensions below 0.1 $\mu$m and even down to 0.05 $\mu$m. However, as the channel lengths of these devices are reduced, problems with the design, operation and fabrication of the devices occur. Features such as lightly doped-drain (LDD) extension regions, having a lower impurity concentration than the source and drain regions, solve some of the operational problems associated with short-channel devices but other problems, including that of the accuracy of equipment currently employed to fabricate devices, remain.

One such problem is the alignment of the source and drain regions of a semiconductor device around such a small channel length (down to 0.05 $\mu$m). Prior art FIG. 1 shows that the source and drain regions meet the gate oxide region 45 of the gate region 35 at reference points 55 producing a shorter effective channel length of the device. When the device is formed, there is some overlap by the gate region over the source and drain regions. Generally, any such overlap becomes a region of unwanted capacitance. It is well known to employ self-alignment of the source and drain regions to the gate regions by forming the gate region first and then aligning the source and drain regions around the gate region. However, with ever smaller devices, processing limitations make such alignment more difficult A further limitation on size reduction concerns photolithography equipment and techniques currently employed. Such equipment is limited in resolution and by physical factors such as reflection and resist mask chemistry.

In a standard, prior art process for forming a transistor such as that shown in FIG. 1, two masks are used to define the device. The first mask defines a window of silicon with an isolation oxide, while a second mask defines where the polysilicon gate will be located. Overlay errors (the error in the alignment of the polysilicon mask in respect to the isolation mask), can become significant once device dimensions become very small (such as, for example, a maximum error of 0.75 $\mu$m on a 0.2 $\mu$m length of diffusion area EPROM). Hence, in a worst case, source resistance would only be 45% of drain resistance, which is not an acceptable design feature of the device. Typical photoresist masks, when applied to reflective films such as polysilicon or silicon are difficult to accurately pattern due to the reflectivity of the films, making it difficult to control line widths and other critical dimensions. Subsequent etching of the underlying films such as polysilicon can introduce more variations. Hence, with channel lengths below 0.1 $\mu$m, there remain several difficult manufacturing problems.

In U.S. Pat. No. 5,571,738 invented by Zoran Krivokapic issuing Nov. 5, 1996 (Krivokapic), the channel length of a transistor is controlled by varying the thickness of an insulation spacer layer. Krivokapic discloses one technique for using insulation layers to define the effective channel length in the range of 0.35 $\mu$m by varying the insulation layer from about 300 to 1,000 Å. Krivokapic teaches a method for forming a relatively conventional cross-section of a raised source/drain MOS transistor. There is a need for a semiconductor device and method for making the same device that ensures that, even at sub-0.1 $\mu$m dimensions, there is very little overlap in the source/drain and gate.

Still another problem is the electrical interference between the close source, gate and drain contacts due to the short channel length. As the channel length 25 of FIG. 1 becomes shorter, it is clear that the metalization layers 50 will continue to move closer together and thereby cause electrical interference between the contacts. There is therefore a need to separate the drain, source and gate contacts to avoid electrical interference as the channel length is reduced.

A further problem is that non-planarized contacts of the source, drain and gate regions at the contact mask level result in an uneven topography that may cause excessive over etching of the silicide layer overlying the polysilicon. Increasing chip density has placed more components on the wafer surface, which in turn, has decreased the area available for surface wiring. The answer to this dilemma has been dual and triple level layer connection schemes, with numerous layers of dielectric and metal layers. Multilevel layer schemes are simple in concept but present one of the semiconductor technology's biggest challenges of forming a planarized device. A device with a multi-level layer design will be dense and have a number of etched surface layer, leaving a topology of different step heights and a mix of surfaces. The type of surface requires planarization techniques to minimize thinning of deposited conduction layers over the steps and allow precise imaging. A need therefore exists to have a fully planarized device at the contact mask level to make the device more reliable.

A still further problem is the cost of purchasing new equipment capable of manufacturing devices with such short channel lengths. To accomplish the move to smaller geometries at a relatively feasible cost, the same equipment used in the fabrication of the devices used to manufacture 0.25 $\mu$m must be reusable at these geometries down to 0.05 $\mu$m.

The present invention is directed to overcoming one or more of the problems as set forth above.

SUMMARY OF THE INVENTION

The invention, roughly described, comprises a novel transistor structure and a method for making the structure.

In one aspect, the apparatus of the present invention comprises a semiconductor apparatus formed on a semiconductor substrate. The apparatus includes a first active region in the substrate, and a second active region adjacent to the surface of the substrate separated from the first active region by a channel region. The first and second active regions may comprise a source and a drain region, respectively. A gate oxide region may overlie at least a portion of the first and second active regions. The apparatus further includes a gate positioned over the channel region and having a first end and a second end respectively associated with the first and second active regions. The gate includes a first low conductive region and a second low conduction region at said first and second ends, respectively.

In a further aspect, spacers are provided at the first and second ends of the gate and define the length of the gate. The spacers may be separated from the gate oxide by a gap, and a polysilicon region my fill the region between the respective spacers, and form extension regions underlying the spacers, between the spacers and the gate oxide.

In a further unique aspect, a method for making the transistor structure of the present invention is provided. In one aspect, the invention comprises: forming a transistor region on a silicon substrate, the region including a first and second spacers on a first side and a second side of the region, respectively, the spacers overlying a first oxide layer on the surface of the substrate; etching the first oxide layer leaving a first and second gaps between the first and second spacers, respectively, an d the silicon substrate; forming a gate oxide layer overlying the surface of the substrate in the transistor region, the gate oxide having a thickness; and fill ing the transistor region with polysilicon to cover the gate oxide region.

The apparatus and method of the present invention allow for the manufacture of extremely small channel length transistor devices using currently employed semiconductor manufacturing technologies and equipment. In addition, operational design features currently employed in standard short channel devices, such as lightly doped drain regions, find an operational equivalent in the method and apparatus of the present invention, allowing greater flexibility in device design and manufacture.

BRIEF DESCRIPTION OF THE DRAWINGS

The invention will be described wit h respect to the particular embodiments thereof. Other objects, features, and advantages of the invention will become apparent with reference to the specification and drawings in which:

FIGS. 2–3A and 4–15 are cross-sectional views depicting the semiconductor device and a method of manufacturing the semiconductor device of the present invention;

DETAILED DESCRIPTION

Reference is now made in detail to the specific embodiments of the present invention, which illustrate the best mode presently contemplated by the inventor for practicing the invention.

Figure 1:
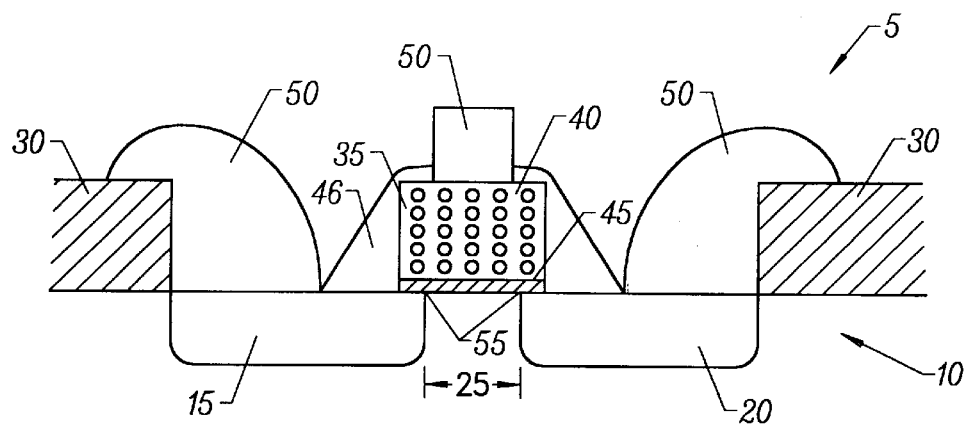
FIG. 1 is a cross-sectional view of a prior art semiconductor device known as a silicon gate metal oxide field effect transistor.
Figure 2:
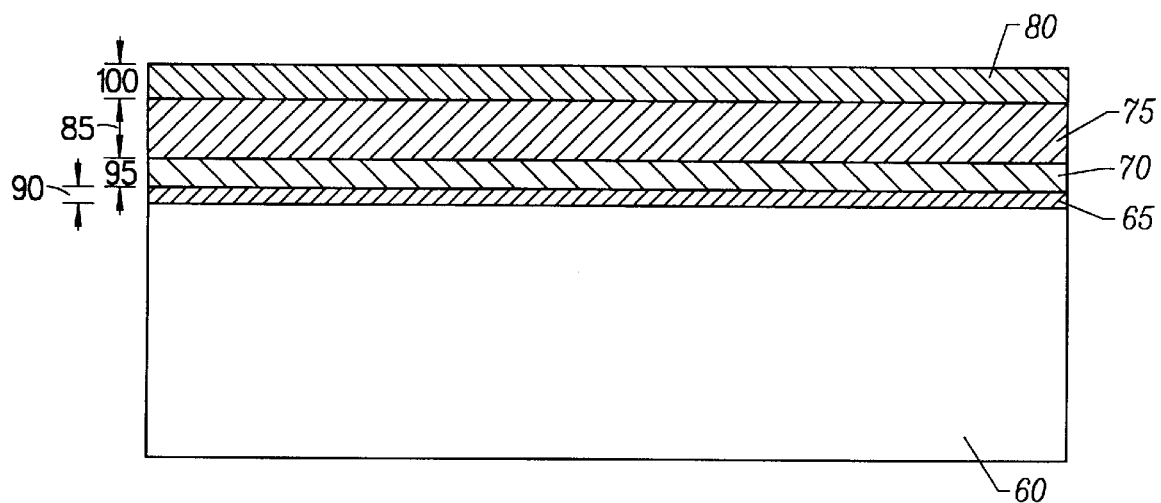

FIGS. 2–3A and 4–15 are cross-sectional views of a series of steps for manufacturing a semiconductor device in accordance with the present invention. On the top surface of a silicon substrate 60, a first oxide layer 65 is formed. The first oxide layer has a first oxide layer height 90 of between 0.01 $\mu$m to 0.03 $\mu$m. The first oxide layer 65 is typically composed of silicon dioxide (SiO2) formed by conventional thermal oxidation techniques. Sequentially deposited on top of the first oxide layer 65 is a first nitride layer 70 having a height 95 of between about 0.05 $\mu$m to 0.07 $\mu$m. The first nitride layer is typically composed of silicon nitride (Si3N4) and is deposited using conventional chemical vapor deposition (CVD) or other technique. After depositing the first nitride layer 70, a second oxide layer 75, composed of, for example, SiO2, is sequentially deposited on the first nitride layer 70 and has a second oxide layer height 85 of between about 0.3 $\mu$m to 0.4 $\mu$m. A final second nitride layer 80 is then deposited on top of the second oxide layer 75. The second nitride layer may be composed of, for example, Si3N4 and has a second nitride layer height 100 of between 0.15 $\mu$m to 0.2 $\mu$m. The layers formed as depicted in FIG. 2 are deposited on the substrate in a conventional manner, typically by thermal oxidation and low pressure chemical vapor deposition, or other suitable techniques.

Figure 3A:
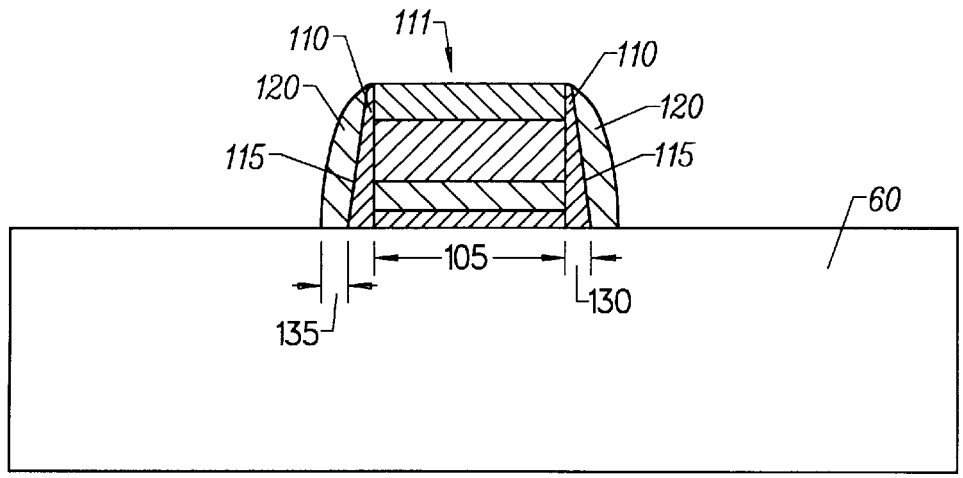

FIG. 3A is a cross-sectional view of the semiconductor device of the present invention after further steps of the method for manufacturing the semiconductor device of the present invention have been performed. These layers have been masked and etched to form a pattern or "definition" stack having an active area length 105. This pattern stack is used to define a region of the substrate wherein the transistor will be formed. The first oxide layer 65, the first nitride layer 70, the second oxide layer 75, and the second nitride layer 80 are then etched to form a stack structure 111, defined by length 105.

Figure 3B:
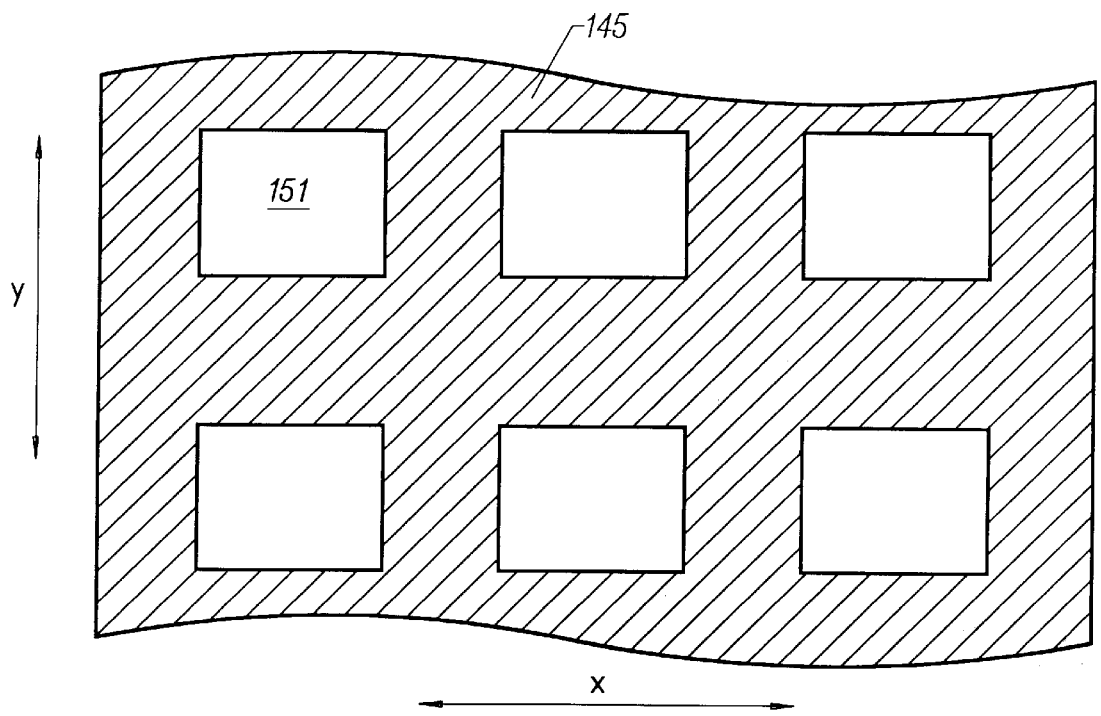
FIGS. 3B and 3C are plan views of the semiconductor device of the present invention depicting the isolation steps utilized to define devices in the X- and Y- directions on the substrate of the present invention.
Figure 3C:
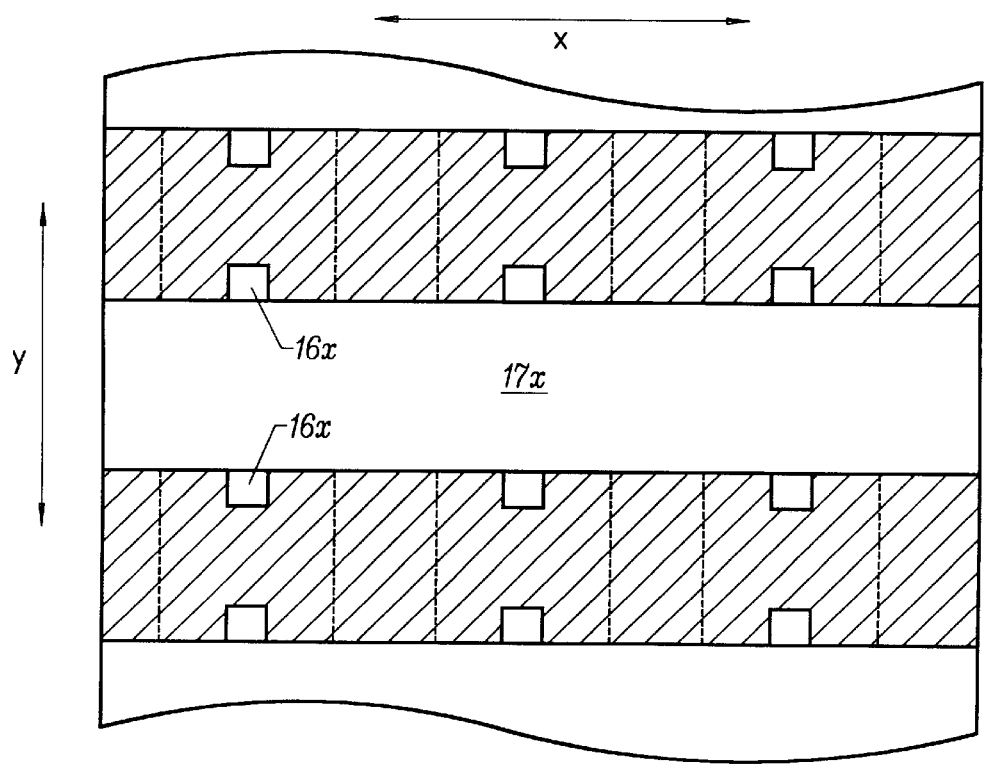

FIGS. 3B and 3C show a top view of the semiconductor device of the present invention illustrating etching of the pattern stack. For reference, it should be understood that FIGS. 2–3A and 4–15 represent views of a device along the X direction shown in FIG. 3. Initially, as shown in FIG. 3B, a device mask 145 is utilized to open windows 151 where the pattern stack will be defined by etching. This area forms diffusion regions of the devices and where the trench isolation (FIG. 4) will be formed. The device mask defines the area along the Y direction (or width) of each device. The four-layer stack—the first oxide layer 65, the second oxide layer 75, the first nitride layer 70 and the second nitride layer 80—is then etched in these regions.

Following formation of the stack 111, as shown in FIG. 3A, a first oxide spacer 110 along the height of the stack structure is formed. The first oxide spacer layer 110 is formed by depositing a spacer oxide layer by a process such as furnace Tetra-ethyl orthosilicate (TEOS) (not shown) having a thickness of about 0.02–0.03 μm and an anisotropically etching the spacer oxide layer to form oxide spacers 110. An alternative approach would be to deposit oxide layer 110 by chemical vapor deposition to a thickness of about 0.01 μm–0.02 μm and etch the layer back to form spacers 110.

First oxide spacers 110 have a lateral surface 115 along the height of the first oxide spacer layer 110. A first set of nitride spacers 120 are then formed adjacent to lateral surface 115 of the first oxide spacers by depositing a nitride layer (not shown) through a conventional CVD process to a thickness of about 0.08–0.15 μm and an anisotropically etching the spacer nitride layer. The first nitride spacer layer 120 has a first nitride spacer layer lateral surface 125. The first oxide spacer layer length 130 may be between 0.01 μm to 0.02 μm while the first nitride spacer layer length 135 is may be between 0.08 μm and 0.15 μm.

With reference to FIGS. 3B and 3C, the first nitride spacers 120 have the effect of reducing the effective width of the windows 151. Next the device width isolation mask 146 is formed. This mask defines where the trench reaches in the X direction. The mask reaches into windows 151 to remove portions of the nitride spacer in squares 16X and the four-layer stack in region 17X.

Figure 4:
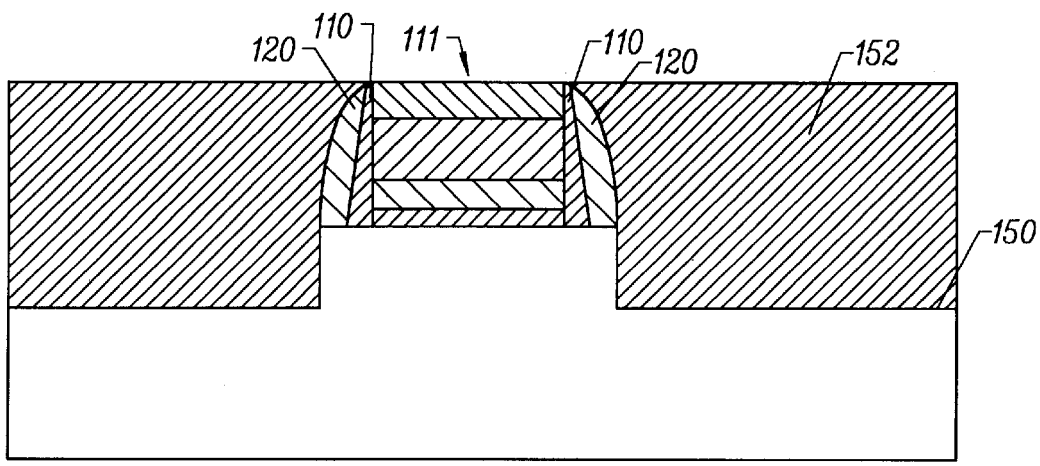

FIG. 4 illustrates the resulting structure after a trench etch and isolation oxide fill. Trench 150 is formed into the substrate 60 by a silicon etch of substrate 60 to allow for isolation of the semiconductor device. The trench 150 is preferably etched into the substrate to a depth 155 of between 0.2 μm to 0.4 μm deep. Subsequently, device isolation is formed in the trench by, for example, a TEOS process depositing oxide 152 in trench 150. The trench oxide 152 has a thickness of about 0.8 to 1.5 μm. The top surface 160 of the trench oxide 152 is then polished to even the upper surfaces of oxide 152 and the second nitride layer top surface 165. The polishing is performed using one of many available conventional chemical mechanical polishing methods.

Figure 5:
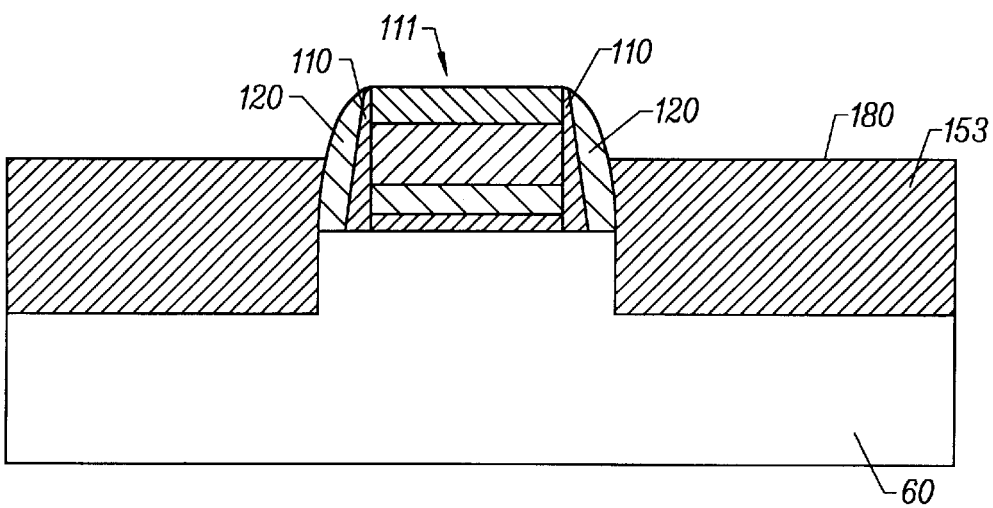
Figure 6:
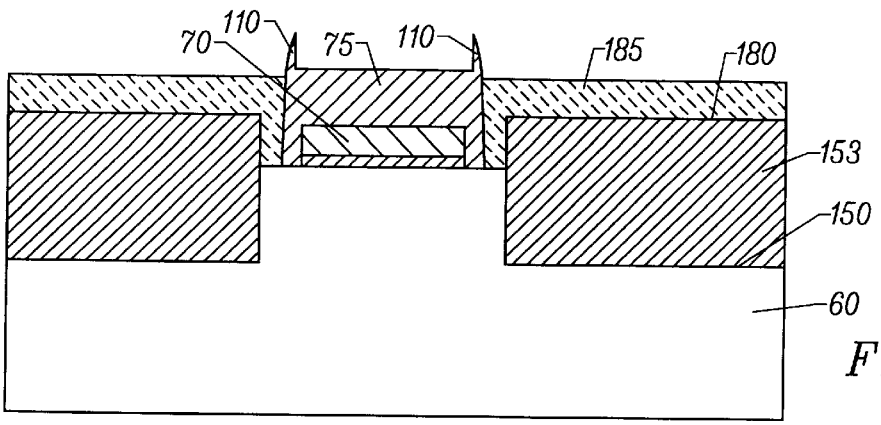

FIGS. 5 and 6 are a cross-sectional view of the semiconductor device of the present invention after additional steps for forming the semiconductor device. In FIG. 5, the trench oxide 152 shown in FIG. 4 is etched to a lower trench oxide 153 by about 0.2–0.3 μm, defining a lowered trench oxide top surface 180. Subsequently, as shown in FIG. 6, a conventional plasma wet etch process is utilized to remove second nitride layer 80 and first nitride spacers 120. A selective epitaxial overgrowth layer (EOL) 185 is then formed on the lowered trench oxide top surface 180 As will become clear through the following steps, provision of the epitaxial silicon at this point in the process produces a conduction and diffusion path to the source and drain regions which will be formed in the device during later process steps, eliminating the need for separate source and drain plugs, as in the 738 patent. The conduction path for the epitaxial layer 185 is made possible by spacers 110 and 120.

Figure 7:
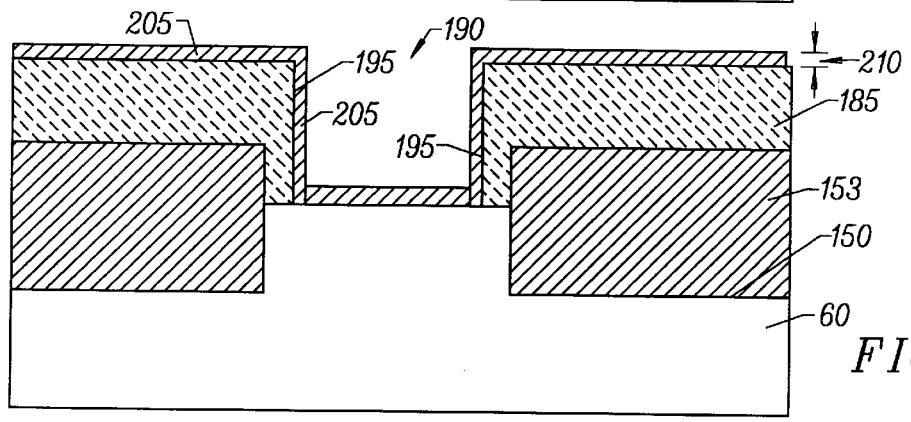

FIG. 7 is a cross-sectional view of the semiconductor device of the present invention after additional steps for manufacturing the device have been performed. In FIG. 7, the second oxide layer 75 and the first oxide spacer 110 have been removed by etching to form a gate region 190. Removal of these layers leaves gate region sidewalls. A third oxide layer 205 is thereafter formed along said gate region sidewalls 195 and on the upper surface of the selective epitaxial lateral overgrowth layer 185. Subsequently, the first nitride layer 70 is removed by a selective etch process, leaving oxide region 200 which is a portion of oxide layer 65.

Figure 8:
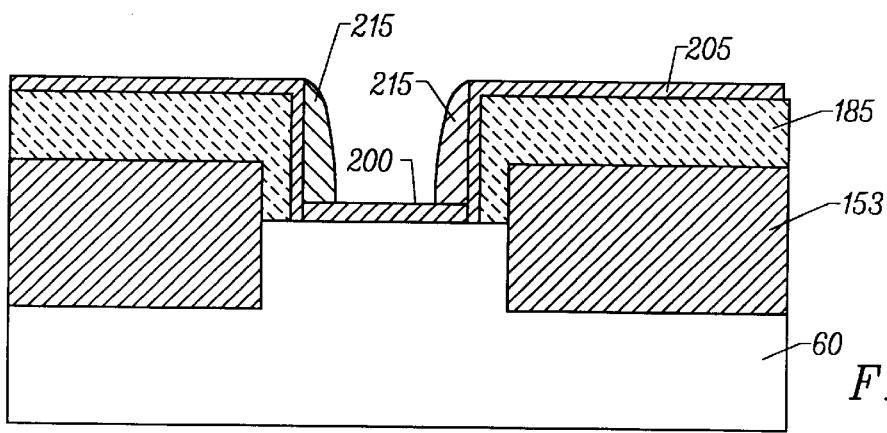

FIG. 8 is a cross-sectional view of the semiconductor device of the present invention after additional steps for manufacturing the device have been performed. In FIG. 8, adaptively controlled spacers 215 are formed in the gate region 190 by depositing, for example, a layer of $Si_3N_4$ having a thickness of approximately 0.05 to 0.15 μm using conventional deposition techniques, and isotopically etching the $Si_3N_4$ layer to yield spacers 215. The thickness of the spacers will be defined by the width 105 of the region 190. The thickness will be approximately one half of the difference between the nominal channel length and length 105.

Figure 9:
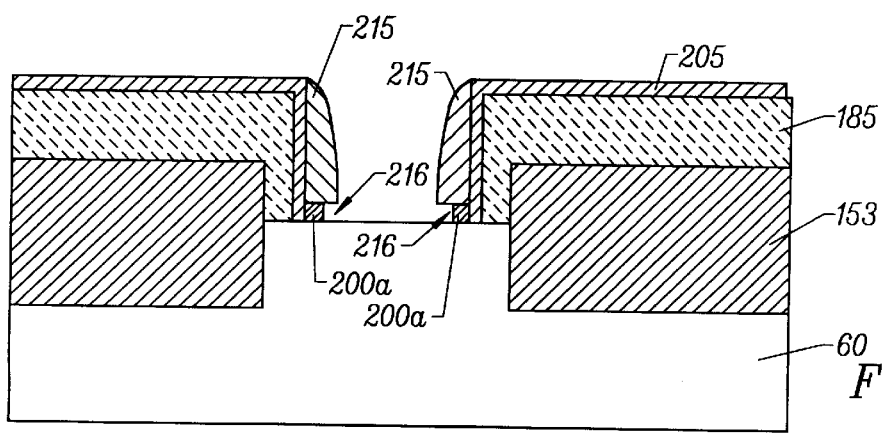
Figure 10:
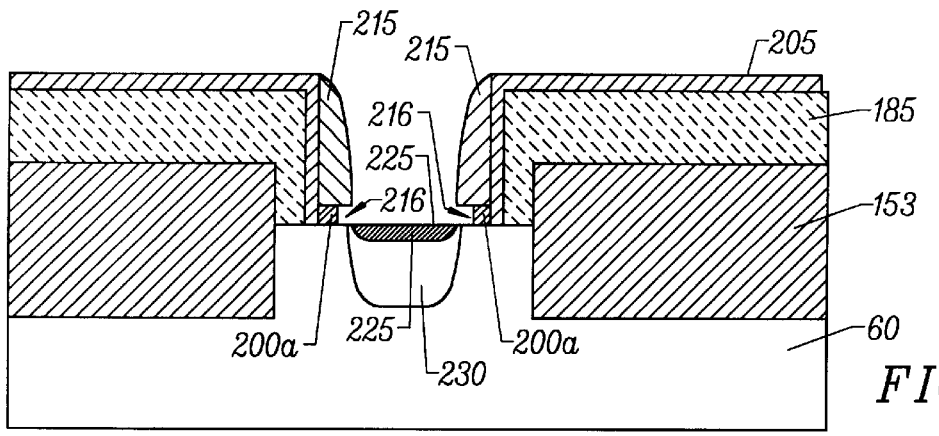

As shown in FIG. 9, oxide region 200 is then etched using a selective mask and etch process to retain oxide 205 on the surface of the epitaxial layer 185, but remove a major portion of layer 200 in regions 216 below the spacers 215, leaving minor portions 200a of layer 200 to provide support for spacers 215. Once the oxide 200 has been removed, as shown in FIG. 10, two channel implants may be performed by implanting impurities into the substrate using conventional techniques. (It should be recognized that in an alternative embodiment, the step of etching oxide 200 may occur subsequent to the following implants). A first implant is used to define the operational threshold voltage ($V_t$) of the device and is performed to form a region 225 having a junction depth on the order of about 0.004 μm. A second, punch-through stop implant is utilized to form region 230 at a junction depth of about 0.02 μm. The shallower $V_t$ implant will define the channel properties of the device by optimizing the threshold voltage $V_t$ of the device. The second, punchthrough stop implant, prevents lowering of the device potential between the source of the drain, and allows the designer to obtain very low leakage current during the off-state of the device. The punchthrough stop implant opposite conductivity type to the source and drain regions formed hereafter.

Figure 11:
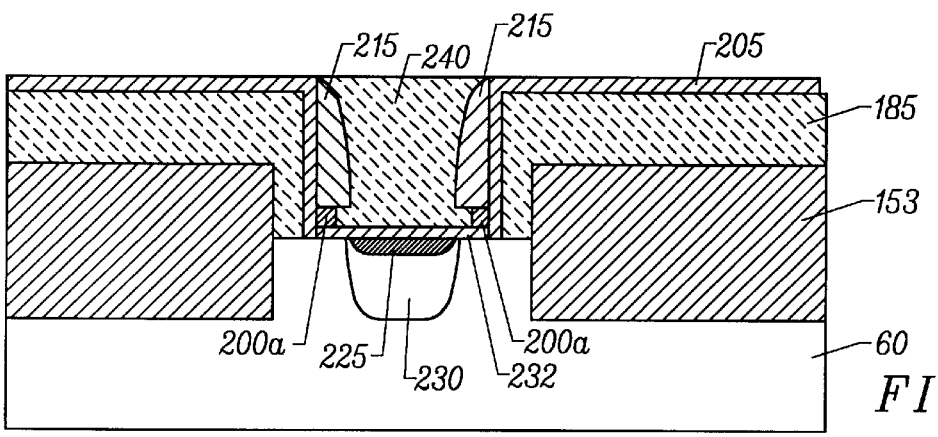

FIG. 11 is a cross-sectional view of the semiconductor device of the present invention after additional processing steps have been completed. As shown in FIG. 11, following formation of the implants, a gate oxide layer 232 is formed on the surface 62 of substrate 60. The gate oxide is typically $SiO_2$, but may be a nitride or oxynitride, and has a thickness of about 0.003 μm. Following formation of gate oxide 232, a polysilicon trench fill 240 is deposited within the gate region 190 adjacent to spacers 215 and filling region 190. It should be noted that in regions 216, the polysilicon reaches oxide 205 underlying spacers 215 completely filling the region 216. Polysilicon layer 240 typically has a thickness in a range of approximately 0.3 to 0.5 μm.

Polysilicon 240 is subsequently polished to form a planarized upper surface of the device as shown in FIG. 11.

Figure 12:
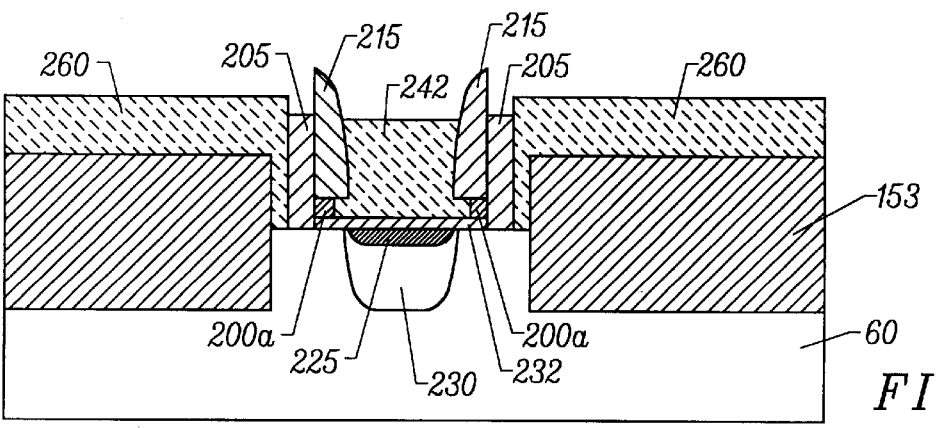

FIG. 12 is a cross-sectional view of the device after additional processing steps, outlined below, have been completed. An oxide etch is used to remove those portions of third oxide layer 205 overlying selective epitaxial lateral overgrowth layer 185 (as shown in FIG. 11).

Figure 13:
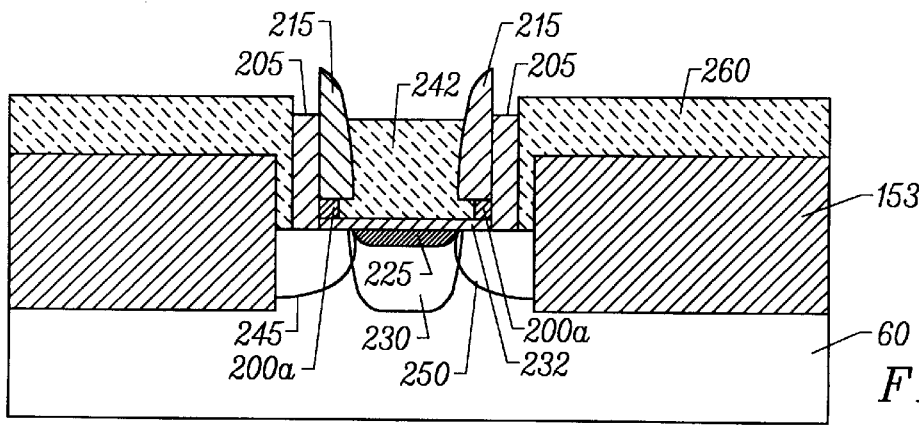

FIG. 13 illustrates the device after formation of a source region 245 and drain region 250. Typically, source region 245 and drain region 250 are formed by a deposition or implantation of an impurity into epitaxial layer 185, and a subsequent drive-in step to cause diffusion of the impurity through the epitaxial layer into the substrate 60. A low energy implant of, for example, an impurity such as boron, at an energy level well-known to one of ordinary skill in the art, followed by a drive in step of heating the device at a temperature of 900–1050° C. for approximately 0.5–1.0 minute will form source and drain regions 245, 250, having a concentration of $5 \times 10^{15}$–$1 \times 10^{16}$ atm/cm$^3$, respectively. As the energy of the implant is relatively low, dopant implanted in the gate will not pass through the gate oxide.

Figure 14:
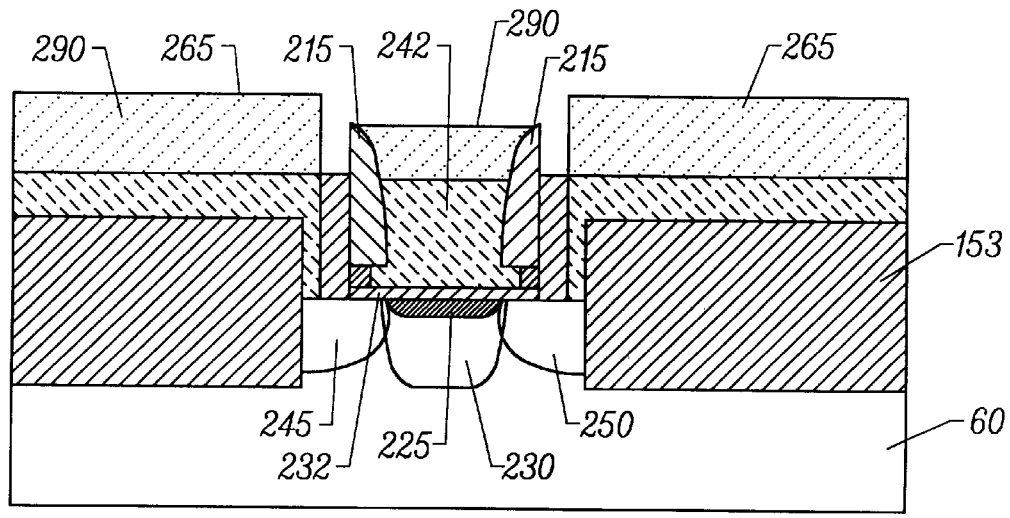
Figure 15:
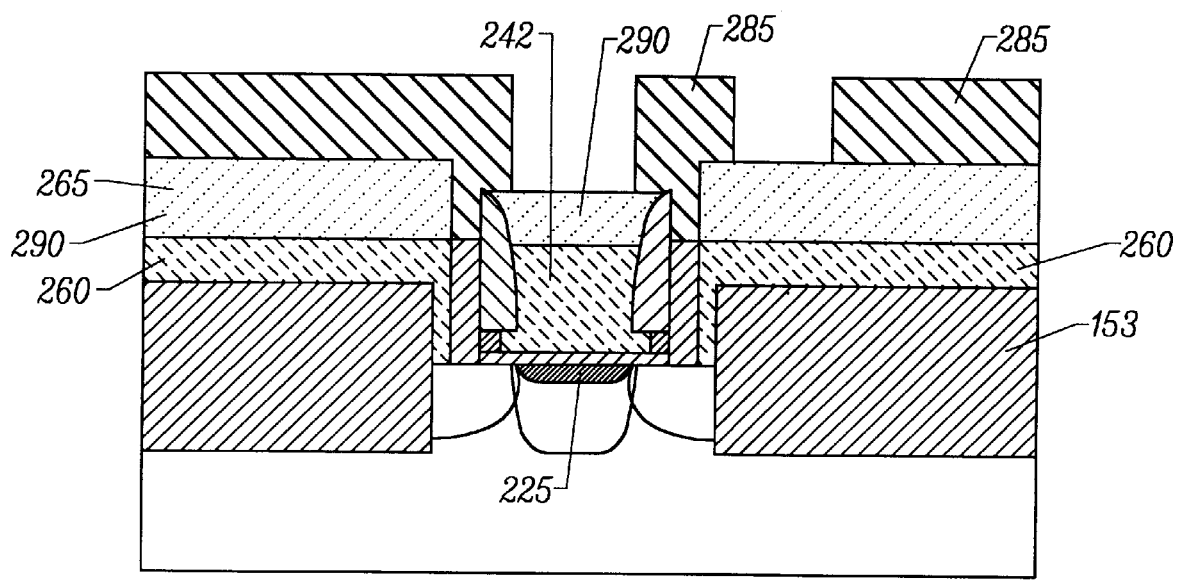

FIG. 14 illustrates formation of a local interconnect layer 265 comprised of a silicide or other suitable interconnect structure. Local interconnect layer 265 and selective epitaxial overgrowth layer 260 enable contact to the source and drain regions formed in the substrate. Contact metal layers are later formed, as shown in FIG. 15, by depositing a oxide mask layer 285, and exposing regions 270 and 275, enabling subsequent metal deposition in such areas to form the source 280 and gate 275 contacts.

Regions 216 of polysilicon 240 underlying spacers 215, form regions having higher resistance in the gate structure than the area of directly overlying the $V_t$ implant. In a typical LDD transistor, lightly doped regions are formed adjacent to the source and drain structure. The device and method of the present invention essentially forms LDD type extension regions in the gate structure, eliminating the need for such regions in the substrate. This saves a substantial number of masking steps over methods incorporating LDD regions in the source and drain, and allows for the formation of smaller channel length transistors which incorporate features similar to those found in LDD type transistors. This further allows modification of extremely short channel devices in the source and drain regions. As will be recognized by one of average skill in the art, a designer will have a great deal of flexibility in adjusting the size and effect of these LDD regions by varying the width of spacers 215, the thickness of oxide 200, and the amount of oxide layer 200 etched away to leave portions 200a.

The many features and advantages of the present invention will be readily apparent to one of average skill in the art. The method of the present invention provides a means to fabricate extremely short channel devices with limited resolution photolithography equipment. The apparatus of the present invention provides an alternative construction to LDD short channel transistors, and is particularly advantageous when used in conjunction with the method of the present invention in providing a short channel transistor with specific design characteristics. These and other advantages of the method and apparatus of the present invention will be readily apparent to one of average skill in the art. Numerous modifications to both the structure and method of the present invention will also be readily apparent to one of average skill. All such features and modifications apparent to one of average skill are considered within the scope of the present invention as disclosed herein by the specification and defined by the following claims.

What is claimed is:

1. A method for forming a transistor comprising the sequential steps of:

forming a transistor region on a silicon substrate, the region including a first and second control spacers on a first side and a second side of the region, respectively, the spacers overlying a first oxide layer on the surface of the substrate;

etching the first oxide layer leaving a first and second gaps between the first and second spacers, respectively, and the silicon substrate;

forming a gate oxide layer overlying the surface of the substrate in the transistor region, the gate oxide having a thickness; and filling the transistor region with polysilicon to cover the gate oxide region.

2. The method of claim 1 wherein said step of forming a transistor region comprises the substeps of:

(A) forming a pattern stack;

(B) forming pattern spacers adjacent to the pattern stack;

(C) forming a trench isolation about the pattern stack; and (D) removing the pattern spacers;

(E) depositing an epitaxial layer over the trench oxide and adjacent to the pattern stack (F) removing the pattern stack; and (G) forming the control spacers in the region to control said short channel length of the device.

3. The method of claim 2 wherein said step (A) comprises the substeps of:

sequentially depositing said first oxide layer, a first nitride layer, a second oxide layer and a second nitride layer on said substrate, each said layer having a layer length, a layer width and a layer height, said second nitride layer having a second nitride layer top surface; and etching said first and second oxide layers and said first and second nitride layers to form a pattern stack.

4. The method of claim 2 wherein said step (B) comprises the substeps of:

(i) forming oxide spacers about the pattern stack; and (ii) forming nitride spacers about the nitride spacers.

5. The method of claim 2 wherein said step (C) comprises:

forming an oxide trench into said substrate, said oxide trench extending above said substrate, said extension being along said first nitride spacer lateral surface;

depositing a trench oxide into said oxide trench, said trench oxide having a trench oxide top surface; and polishing the trench oxide top surface and second nitride layer top surface.

6. The method of claim 1 further including the step of:

forming a source and drain region by depositing an impurity into the epitaxial layer and heating the substrate.

7. A method for forming a short channel transistor, comprising the steps of:

forming a definition stack comprising an oxide layer, a first silicon nitride layer, a second, thick oxide layer, and a second silicon nitride layer;

forming first spacers adjacent to the stack;

forming isolation oxide about the stack and spacers;

removing second silicon nitride layer, the second oxide layer and the first nitride layer, leaving a transistor formation region in the isolation oxide;

forming a second nitride spacer in the transistor region;

removing the first oxide layer;

forming a gate oxide layer having at least a portion underlying the second spacers; and filling the transistor region with silicon.

* * * * *